United States Patent
Vashchenko et al.

(10) Patent No.: US 6,720,624 B1
(45) Date of Patent: Apr. 13, 2004

(54) LVTSCR-LIKE STRUCTURE WITH INTERNAL EMITTER INJECTION CONTROL

(75) Inventors: Vladislav Vashchenko, Palo Alto, CA (US); Ann Concannon, San Jose, CA (US); Peter J. Hopper, San Jose, CA (US); Marcel ter Beek, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/210,942

(22) Filed: Aug. 2, 2002

(51) Int. Cl.[7] .............................................. H01L 23/62
(52) U.S. Cl. ...................... 257/360; 257/173; 257/141; 257/162

(58) Field of Search .................................. 257/360, 162, 257/141, 173

(56) References Cited

U.S. PATENT DOCUMENTS 6,423,985 B1 * 7/2002 Yu .............................. 257/107
6,433,368 B1 * 8/2002 Vashchenko et al. ........ 257/173

* cited by examiner

*Primary Examiner*—Jerome Jackson
(74) *Attorney, Agent, or Firm*—Jurgen Vollrath

(57) ABSTRACT

In an ESD protection device using a LVTSCR-like structure, the holding voltage is increased by placing the p+ emitter outside the drain of the device, thereby retarding the injection of holes from the p+ emitter. The p+ emitter may be implemented in one or more emitter regions formed outside the drain. The drain is split between a n+ drain and a floating n+ region near the gate to avoid excessive avalanche injection and resultant local overheating.

16 Claims, 2 Drawing Sheets

LVTSCR-LIKE STRUCTURE WITH INTERNAL EMITTER INJECTION CONTROL

FIELD OF THE INVENTION

The invention relates to a new ESD protection structure. More particularly, it relates to a LVTSCR-like structure with high holding voltage, for protecting CMOS and Bi-CMOS integrated circuits against electrostatic discharge and electrical overstress.

BACKGROUND OF THE INVENTION

Analog circuits typically display sensitivity to excessive voltage levels. Transients, such as electrostatic discharges (ESD) can cause the voltage handling capabilities of the analog circuit to be exceeded, resulting in damage to the analog circuit. Clamps have been devised to shunt current to ground during excessive voltage peaks.

One of the difficulties encountered in designing such protection circuitry is that the specifications for these clamps have to fit within a relatively small design window that, on the one hand, must take into account the breakdown voltage of the circuit being protected, and, on the other hand, avoid latch-up under normal operation. ESD clamps are designed to handle short voltage peaks and are not suitable for sustained high voltages. They therefore have a holding voltage parameter below which they are sustainable under non-ESD conditions. Thus, the clamp must be designed so as to be activated below the breakdown voltage of the circuit that is to be protected. At the same time, the clamps holding voltage must exceed the normal operating voltage of the protected circuit, to avoid latch-up.

A wide variety of ESD protection structures have been devised, each with different characteristics. For example, some protection clamps employ avalanche diodes such as zener diodes to provide the bias voltage for the base of a subsequent power bipolar junction transistor (BJT). Another device that has been used is the grounded gate NMOS device (GGNMOS). However, GGNMOS devices are not only large, consuming a lot of space on a chip, they also suffer from the disadvantage that they support only limited current densities. The protection capability of an ESD protection device can be defined as the required contact width of the structure required to protect against an ESD pulse amplitude, or, stated another way, as the maximum protected ESD pulse amplitude for a given contact width. Thus, the smaller the contact width for a given ESD pulse amplitude protection, the better.

A commonly used protection clamp, especially for CMOS and BiCMOS circuits, therefore, makes use of a low voltage silicon controlled rectifier (LVTSCR). These support approximately 10 times more pulse power after snapback than do GGNMOS devices. However, they suffer from the drawback that they display low holding voltages. Thus they experience latch-up if the voltage after the ESD event does not return to a voltage lower than the holding voltage. As a result they are typically only used in power clamp applications.

However, it would be desirable to be able to use LVTSCRs in CMOS technology in so-called overvoltage cells. Overvoltage cells make use of cascoded structures in order to provide sufficiently large voltage drops to avoid gate breakdown. (In one process —CMOS9DGO by National Semiconductor—5.5V cells have a gate breakdown of approximately 4V) The major limitation to the use of LVTSCRs in such applications is the low holding voltage of about 2V, which creates latch-up problems.

The present invention seeks to address this problem by providing a LVTSCR-like structure with higher holding voltage. For ease of understanding, it is useful to look at the structure and workings of a conventional LVTSCR.

A low voltage silicon-controlled rectifier (LVTSCR) is a device that provides an open circuit between a first node and a second node when the voltage across the first and second nodes is positive and less than a trigger voltage. When the voltage across the first and second nodes rises to be equal to or greater than the trigger voltage, the SCR provides a low-resistance current path between the first and second nodes. Further, once the low-resistance current path has been provided, the SCR maintains the current path as long as the voltage across the first and second nodes is equal to or greater than a holding voltage that is lower than the trigger voltage. When used for ESD protection, the first node becomes a to-be-protected node, and the second node is typically connected to ground. The SCR operates within an ESD protection window that has a maximum voltage defined by the destructive breakdown level of the to-be-protected node, and a minimum voltage (also known as a latch-up voltage) defined by any dc bias on the to-be-protected node.

Thus, when the voltage across the to-be-protected node and the second node is less than the trigger voltage, the LVTSCR provides an open circuit between the to-be-protected node and the second node. However, when the to-be-protected node receives a voltage spike that equals or exceeds the trigger voltage, such as when an ungrounded human-body discharge occurs, the LVTSCR provides a low-resistance current path from the to-be-protected node to the second node. In addition, once the ESD event has passed the voltage on the to-be-protected node has to again fall below the holding voltage for the LVTSCR to again provide an open circuit between the to-be-protected node and the second node.

FIG. 1 shows a cross-sectional diagram that illustrates a conventional LVTSCR 100. The LVTSCR 100 has a n-well 112 formed in a p-type material 110. n+ and p+ regions are formed in each of the n-well 112 and the p-material 110. In the case of the n-well 112 the regions include n+ region 114 and p+ region 116. For the p-material 110, the regions are n+ region 122 and p+ region 124. Furthermore, a n+ (drain) region 130 is formed in both material 110 and n-well 112, and a channel region 132 is defined between n+ (source) region 122 and n+ (drain) region 130. In addition, LVTSCR 100 includes a gate 136. N+ (source and drain) regions 122, 130, and gate 136 define a NMOS transistor 138 which is typically formed to be identical to the to-be-protected MOS transistors in the circuit.

In operation, when the voltage on the drain of a conventional NMOS transistor spikes up, the drain-to-substrate junction of the NMOS transistor breaks down, for example, at 7 volts, while the gate oxide layer that isolates the gate from the drain destructively breaks down at, for example, 10–15 volts.

Since NMOS transistor 138 is formed to be identical to the to-be-protected MOS transistors, the junction between n+ region 130 and material 110 breaks down at the same time that the to-be-protected MOS transistors experience junction breakdown, thereby preventing destructive breakdown of the MOS transistors that are being protected.

In operation, when the voltage across node 120 (low voltage node) and 126 (high voltage node) is positive and less than the trigger voltage, the voltage reverse biases the junction between n-well 112 and p-type material 110. The reverse-biased junction, in turn, blocks charge carriers from flowing from node 120 to node 126. However, when the voltage across nodes 120 and 126 is positive and equal to or greater than the trigger voltage, the reverse-biased junction breaks down due to avalanche multiplication.

The breakdown of the junction causes a large number of holes to be injected into material 110, and a large number of electrons to be injected into n-well 112. The increased number of holes increases the potential of material 110 in the region that lies adjacent to n+ region 122, and eventually forward biases the junction between material 110 and n+ region 122.

When the increased potential forward biases the junction, a npn transistor that utilizes n+ region 122 as the emitter, p-type material 110 as the base, and n-well 112 as the collector turns on. When turned on, n+ (emitter) region 122 injects electrons into (base) material 110. Most of the injected electrons diffuse through (base) material 110 and are swept from (base) material 110 into (collector) n-well 112 by the electric field that extends across the reverse-biased junction. The electrons in (collector) n-well 112 are then collected by n+ region 114.

A small number of the electrons injected into (base) material 110 recombine with holes in (base) material 110 and are lost. The holes lost to recombination with the injected electrons are replaced by holes injected into (base) material 110 by the broken-down reverse-biased junction and, as described below, by the collector current of a pnp transistor, thereby providing the base current.

The electrons that are injected and swept into n-well 112 also decrease the potential of n-well 112 in the region that lies adjacent to p+ region 116, and eventually forward bias the junction between p+ region 116 and n-well 112. When the decreased potential forward biases the junction between p+ region 116 and n-well 112, a pnp transistor formed from p+ region 116, n-well 112, and material 110, turns on.

When turned on, p+ emitter 116 injects holes into base 112. Most of the injected holes diffuse through (base) n-well 112 and are swept from (base) n-well 112 into (collector) material 110 by the electric field that extends across the reverse-biased junction. The holes in (collector) material 110 are then collected by p+ region 124.

A small number of the holes injected into (base) n-well 112 recombine with electrons in (base) n-well 112 and are lost. The electrons lost to recombination with the injected holes are replaced by electrons flowing into n-well 112 as a result of the broken-down reverse-biased junction, and n-well 112 being the collector of the npn transistor. Thus, a small part of the npn collector current forms the base current of the pnp transistor.

Similarly, as noted above, the holes swept into (collector) material 110 also provide the base current holes necessary to compensate for the holes lost to recombination with the diffusing electrons injected by n+ (emitter) region 122. Thus, a small part of the pnp collector current forms the base current of the npn transistor.

Thus, n+ region 122 injects electrons that provide both the electrons for the collector current of the npn transistor as well as the electrons for the base current of the pnp transistor. At the same time, p+ region 116 injects holes that provide both the holes for the collector current of the pnp transistor as well as the holes for the base current of the npn transistor.

Thus, one of the advantages of LVTSCR 100 over other ESD protection devices, such as a grounded-gate MOS transistor, is the double injection provided by n+ region 122 and p+ region 116 of LVTSCR 100. With double injection, LVTSCR 100 provides current densities (after snapback) that are about ten times greater than the densities provided by a grounded-gate MOS device. Since junction break down occurs before the MOS transistors experience destructive gate oxide break down, LVTSCR 100 turns on before destructive gate oxide breakdown occurs, thereby protecting the MOS transistors. Thus, the junction breakdown voltage, which is less than the voltage level that causes destructive gate oxide breakdown, functions as the trigger voltage. LVTSCRs also have the flexibility that the triggering voltage can readily be adjusted. Techniques, such as reducing the width of channel region 132, can be used to lower the trigger voltage to ensure that the junction between region 130 and material 110 breaks down before the to-be-protected MOS transistors experience junction breakdown.

However, as mentioned above, one disadvantage of LVTSCR 100, and, for that matter, any SCR is that it suffers from a holding voltage that is often less than the minimum (or latch-up) voltage of the ESD protection window. The low holding voltage of the LVTSCR which lies in the range of less than two volts, is due to the double junction injection of its conductivity modulation mechanism. While the p+ emitter allows one to define how many holes are injected, the injection of the holes leads to greater space charge neutralization and thus a lower holding voltage. As a result, standard LVTSCRs are unattractive candidates for providing ESD protection to power supply pins.

As mentioned above, the major requirement when designing ESD protection circuits, is that the circuit should operate within a so-called "ESD protection window" that is defined by both the maximum voltage in the protected line (which is related to the breakdown of the protected circuits) and the latch-up voltage when the DC bias is presented in the protected line. In the LVTSCR, when the minimum (or holding) voltage is equal to or less than a dc bias, such as the power supply voltage, LVTSCR 100 cannot turn off (thus latching up) after the ESD event has passed. Thus, power must be cycled after the ESD event, to switch off the LVTSCR.

For example, assume that node 120 is a power supply pin at 3.3 volts, node 126 is a ground pin, the junction breakdown voltages of the to-be-protected MOS transistors are 7.0 volts, and the holding voltage is 1.8 volts. In this example, LVTSCR 100 is initially turned off under normal operating conditions (prior to an ESD event) when the voltage on node 120 is 3.3 volts. When the voltage on node 120 spikes up to a value equal to or greater than the trigger voltage (7 volts in this example), LVTSCR 100 turns on, thereby protecting the MOS devices that receive power from node 120. However, once the ESD event has passed, since the normal operating voltage on node 120 is 3.3 volts, and it takes only 1.8 volts on node 120 to keep LVTSCR 100 turned on, LVTSCR 100 remains turned on (latched up) after the ESD event has passed.

Thus, in spite of higher current availability from an LVTSCR after snap back, conventional CMOS integrated circuits are usually protected by grounded gate NMOS snap back structures (GGNMOS) due to the latch-up limitations of LVTSCRs.

One solution used in the past for addressing the low holding voltage problem in LVTSCRs is to make use of a circuit that introduces a feedback loop with diodes between the n+ emitter region 114 of the LVTSCR and the p+ region 116 to cut off injection from the emitter-well junction, as shown in FIG. 2. In the circuit of FIG. 2, three external diodes 200, 204, 206 are included in the circuit. (For ease of understanding, an LVTSCR structure that is substantially the same as that of FIG. 1, except for the separate contacts to n+ region 114 and p+ region 116, is shown in the circuit of FIG. 2). The use of external diodes, however, requires additional circuit elements which makes the circuit larger and more complicated to implement. What is needed is a compact solution to the problem wherein a structure is created that has the benefits of a LVTSCR while having a higher holding voltage characteristic.

SUMMARY OF THE INVENTION

The present invention provides an LVTSCR-like structure having an increased holding voltage. The present invention seeks to increase the holding voltage by cutting off the injection from the emitter junction at some point after triggering. In particular it introduces one or more p-n junctions with a negative feedback loop to the p+ emitter of the LVTSCR-like structure. By introducing one or more p+ regions in the n-well of the LVTSCR-like structure, to form the p-n junctions, the junctions share a common n-region, thereby creating characteristics that are not purely diode-like but include characteristics of an extra emitter. This produces a two stage S-shape I-V characteristic.

According to the invention, there is provided a LVTSCR-like ESD protection structure having a first p+ emitter, wherein the structure displays a two-stage snapback triggering characteristic created by providing an additional p-type emitter in an n-well of the structure. Typically a feedback loop is provided from the n-well or a n+ region in the n-well back to the first p+ emitter. The feedback loop may be provided from the n-well or a n+ region in the n-well back to the first p+ emitter, and may be formed from a backend metalization layer. The additional p-type emitter may be provided by forming one or more p+ regions in the n-well.

Further, according to the invention, there is provided a LVTSCR-like ESD protection structure, comprising a p-epitaxial layer or substrate, a n-well formed in the p-epitaxial layer or substrate, a first n+ region and a first p+ region formed in the p-epitaxial layer or substrate, or in a p-well in the p-epitaxial layer or substrate, a second n+ region and a second p+ region formed in the n-well, and at least one additional p+ region formed in the n-well with a feedback loop from the n-well or from a n-type region adjacent the additional p+ region, back to the second p+ region. More than one additional p+ region may be formed in the n-well, each with an adjacent n-type region to define p-n junctions. The feedback loop may be formed by a backend metalization layer. Preferably the second n+ region is connected to an adjacent additional p+ region by a first metalization layer. Where there are several additional p-n junctions, the second n+ region is preferably electrically connected to a first additional p+ region, and the n-well or n-type region adjacent said first additional p+ region is electrically connected to a second additional p+ region. The connection between the second n+ region and the first additional p+ region, and the connection between the n-well or n-type region adjacent said first additional p+ region, and the second additional p+ region, may be formed using a first metalization layer. A feedback loop may be formed from an n-type region adjacent the second additional p-type region, back to the second p+ region, using a second metalization layer.

Still further, according to the invention, there is provided a method of increasing the holding voltage of a LVTSCR structure, comprising forming at least one additional p-type structure to define at least one additional p-n junction in a n-well of the LVTSCR, and providing a feedback loop from the n-region of the p-n junction located furthest from the p+ emitter of the LVTSCR, back to the p+ emitter.

Still further, according to the invention, there is provided a method of increasing the holding voltage of a LVTSCR structure, comprising forming one or more diode structures in a n-well of the LVTSCR structure and forming a feedback loop back to the p+ emitter of the LVTSCR. Preferably p-type and n-type regions of adjacent diodes are connected together by a first metalization step, and the feedback loop is formed by a second metalization step. The second metalization step may be a backend metalization step.

DETAILED DESCRIPTION OF THE INVENTION

Figure 1:
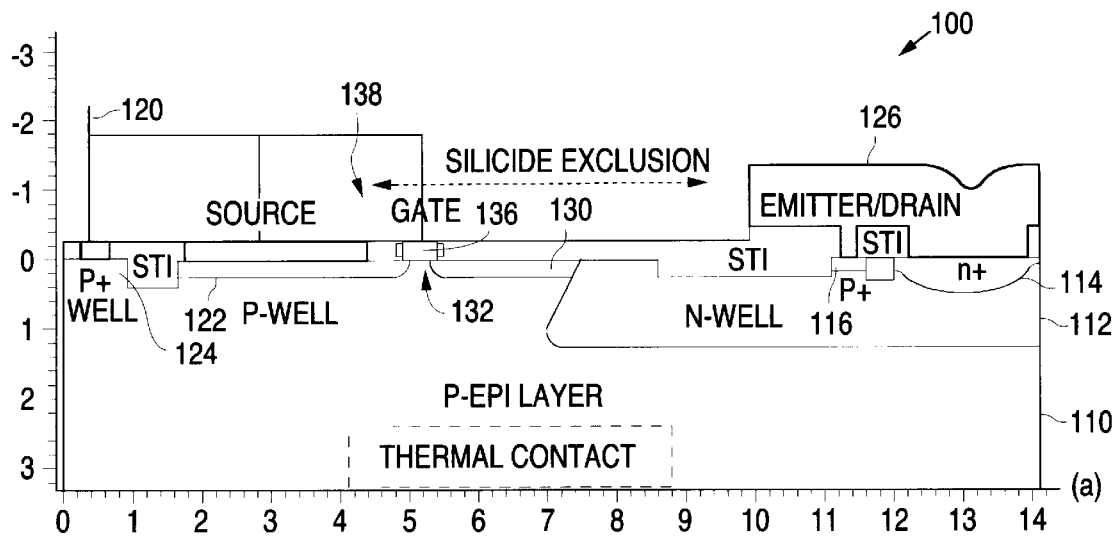
FIG. 1 is a cross-sectional view illustrating a conventional LVTSCR.
Figure 2:
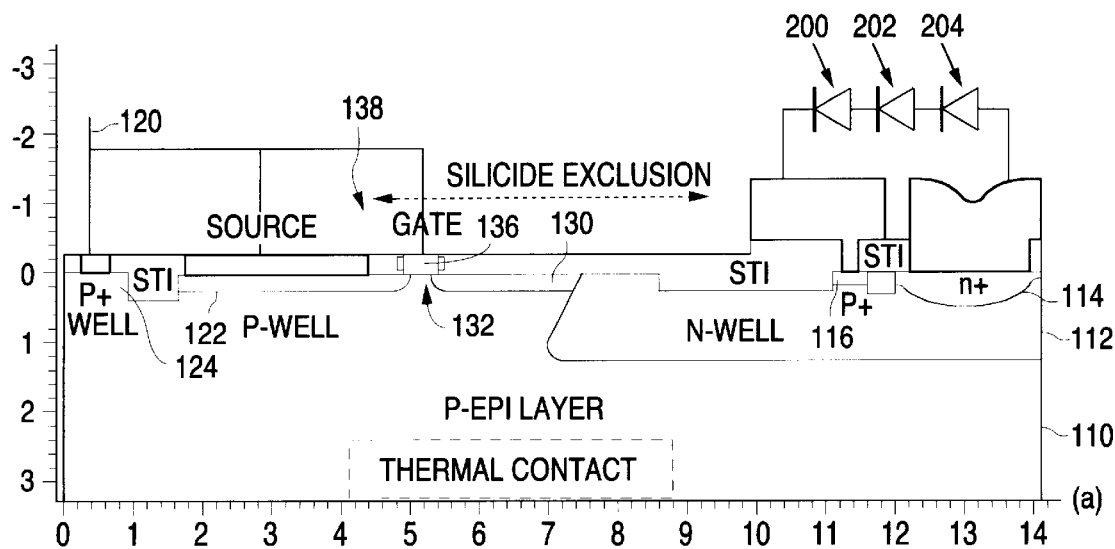
FIG. 2 is a prior art circuit using a conventional LVTSCR.
Figure 3:
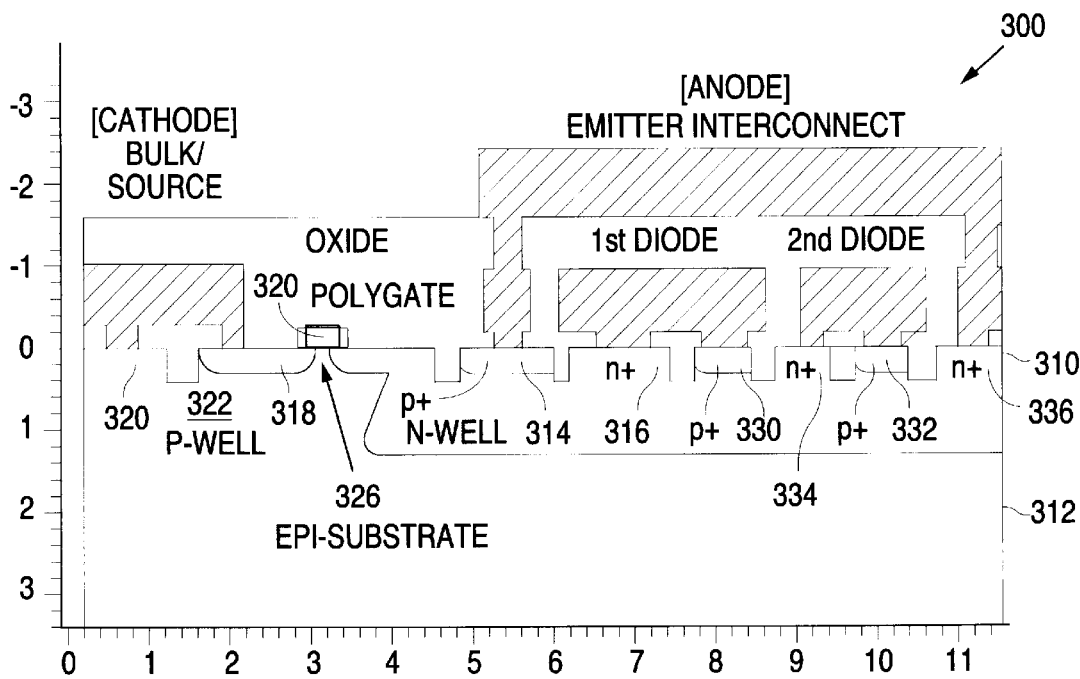
FIG. 3 is a cross-sectional view of one embodiment of a LVTSCR-like structure of the invention.

FIG. 3 shows one embodiment of the invention. The LVTSCR-like structure 300 of FIG. 3 includes a n-well 310 formed in a p-epitaxial layer of substrate 312. Like a conventional LVTSCR, it has a p+ emitter region 314 and n+ region 316 formed in the n-well 310, and a n+ region 318 and a p+ region 320 formed in the p-substrate 312 or, as in this case, in a p-well 322 formed in the p-substrate 312. It also includes a gate 324 formed over a channel 326. In order to achieve an increased holding voltage, the present invention introduces additional p-n junctions in the n-well 310. This is done by forming p+ regions 330, 332 in the n-well. In one embodiment, n+ regions 334, 336 are also formed in the n-well 310. However, it will be appreciated that p-n junctions will exist even in the absence of the additional n+ regions 334, 336, due to junctions between the p+ regions 330, 332 and the n-well 310.

As shown in FIG. 3, n+ region 316 is connected to p+ region 330, and n+ region 334 is connected to p+ region 332. This defines two p-n junctions: one between p+ region 330 and n+ region 334, and one between p+ region 332 and n+ region 336. In one embodiment, this connection is achieved by making use of a first metal layer. Typically the connection between the n+ region 318 and p+ region 320 for the cathode is made at the same time when the first metal layer is formed.

Furthermore, a connection is made between n+ region 336 and p+ emitter region 314 to define a feedback loop. This is achieved, in the present embodiment by making use of a second metal layer created as part of the standard process. Thus the structure 300 defines a compact LVTSCR-like structure with additional internal p-n junctions and a feedback loop to the p+ emitter, which makes use only of backend metalization to implement the feedback.

The effect of providing the additional p-n junctions and the feedback loop is to cut off carrier injection from the p+ emitter 314 after the ESD event has passed, thereby increasing the holding voltage of the structure 300. This is achieved since the p-n junctions create voltage drops which are fed back to the p+ emitter 314 to reduce the potential at the p+ emitter.

Figure 4:
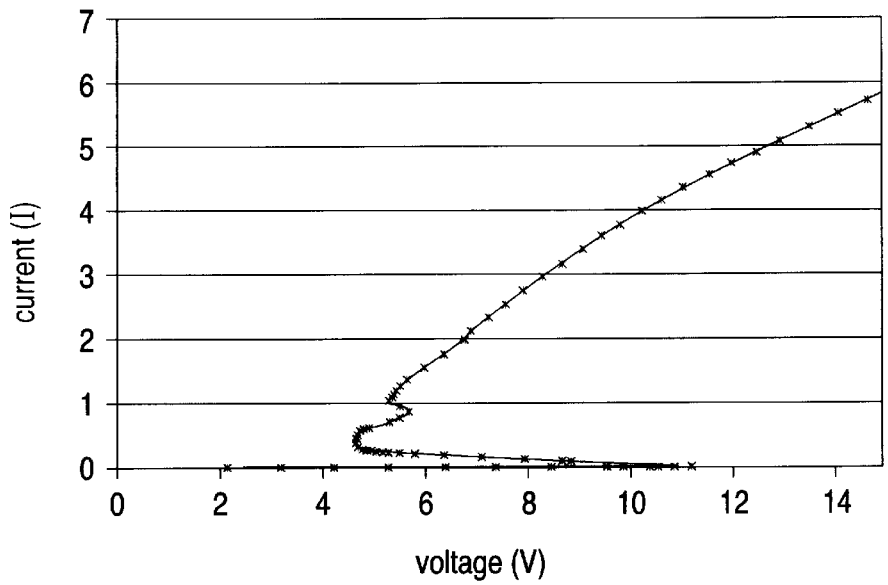
FIG. 4 shows an I-V curve for a structure of the invention.

By sharing the same n-well 310, the p+ regions 330, 332 act not only like diodes in the emitter line but also define an extra emitter. As a result, the experimental I-V characteristics shown in FIG. 4 (curve 400), demonstrate a two stage S-shaped characteristic.

It will be appreciated that the structure of the invention can be implemented in different ways without departing from the scope of the invention, as defined by the claims. For example, the number of p-n junctions introduced into the structure can be changed, and different ways can be used to connect the n and p regions, and to provide the feedback loop. Also, as mentioned above, instead of the n+ regions 334, 336, the n-well structure 310 can simply be used to define the p-n junctions with the p+ regions 330, 332. More generally, while some regions have been shown as n+ or p+, the doping level may vary for different embodiments. Therefore, the use of the term p-type region or n-type region includes highly doped regions such as p+ regions and n+ regions.

The embodiments discussed above were for a non-cascoded structure, however, the present invention can also be implemented in a cascoded structure.

What is claimed is:

1. A LVTSCR-like ESD protection structure having a first p+ emitter, wherein the structure displays a two-stage snapback triggering characteristic created by providing an additional p-type emitter in an n-well of the structure.

2. A structure of claim 1, wherein the additional p-type emitter is provided by forming one or more p+ regions in the n-well.

3. A structure of claim 2, wherein a feedback loop is provided from the n-well or a n+ region in the n-well back to the first p+ emitter.

4. A structure of claim 1, wherein the feedback loop is formed from a second metal backend metalization layer.

5. A LVTSCR-like ESD protection structure, comprising
a p-epitaxial layer or substrate,
a n-well formed in the p-epitaxial layer or substrate,
a first n+ region and a first p+ region formed in the p-epitaxial layer or substrate, or in a p-well in the p-epitaxial layer or substrate,
a second n+ region and a second p+ region formed in the n-well, and
at least one additional p+ region formed in the n-well defining a diode with the second n+ region with a feedback loop from the n-well or from a n-type region adjacent the additional p+ region, back to the second p+ region.

6. A structure of claim 5, wherein more than one additional p+ region is formed in the n-well, each with an adjacent n-type region to define at least a first and a last diode in the n-well p-n junctions.

7. A structure of claim 5, wherein the feedback loop is formed by a second metal backend metalization layer.

8. A structure of claim 5, wherein the second n+ region is connected to an adjacent additional p+ region by a first metalization layer.

9. A structure of claim 6, wherein the second n+ region is electrically connected to a first additional p+ region, and the n-well or n-type region adjacent said first additional p+ region is electrically connected to a second additional p+ region so that the anode and cathode of adjacent diodes are connected to each other.

10. A structure of claim 9, wherein the connection between the second n+ region and the first additional p+ region, and the connection between the n-well or n-type region adjacent said first additional p+ region, and the second additional p+ region, are formed using a first metalization layer.

11. A structure of claim 10, wherein a feedback loop is formed from an n-type region adjacent the second additional p-type region, back to the second p+ region, using a second metalization layer to connect the anode of the first diode to the cathode of the last diode.

12. A method of increasing the holding voltage of a LVTSCR structure, comprising
forming at least one additional p-type structure to define at least one diode additional p-n junction in a n-well of the LVTSCR, and
providing a feedback loop from the cathode n-region of the diode p-n junction located furthest from the p+ emitter of the LVTSCR, back to the p+ emitter.

13. A method of claim 12, wherein the feedback loop is provided by a backend metalization step.

14. A method of increasing the holding voltage of a LVTSCR structure, comprising
forming one or more diode structures in a n-well of the LVTSCR structure and
forming a feedback loop from the cathode of the diode located furthest from the p+ emitter of the LVTSCR back to the p+ emitter of the LVTSCR.

15. A method of claim 14, wherein p-type and n-type regions of adjacent diodes are connected together by a first metalization step, and the feedback loop is formed by a second metalization step.

16. A method of claim 15, wherein the second metalization step is a backend metalization step.

* * * * *